United States Patent [19]

Yanagida

[11] Patent Number: 5,378,653
[45] Date of Patent: Jan. 3, 1995

[54] METHOD OF FORMING ALUMINUM BASED PATTERN

[75] Inventor: Toshiharu Yanagida, Kanagawa, Japan

[73] Assignee: Sony Corporation, Tokyo, Japan

[21] Appl. No.: 36,287

[22] Filed: Mar. 24, 1993

[30] Foreign Application Priority Data

Apr. 8, 1992 [JP] Japan .................................. 4-087142

[51] Int. Cl.$^6$ ........................ H01L 21/44; H01L 21/48
[52] U.S. Cl. .................................. 437/194; 156/643; 156/646; 156/665; 437/225
[58] Field of Search .................. 156/643, 646, 665; 437/194, 225

[56] References Cited

U.S. PATENT DOCUMENTS 2,795,491 6/1957 Newman et al. ................. 156/665
4,980,752 12/1990 Jones, Jr. .

FOREIGN PATENT DOCUMENTS 59-22374  5/1984 Japan .
4-343422 11/1992 Japan .
4-343423 11/1992 Japan .

OTHER PUBLICATIONS

K. Ninomiya et al., "Role of Sulfur Atoms in Microwave Plasma Etching of Silicon", J. Applied Phys., vol. 62, No. 4, Aug. 15, 1987, pp. 1459–1468.
S. Wolf et al., *Silicon Processing for the VLSI Era*, vol. 1, Lattice Press, Sunset Beach, Calif., 1986, pp. 564–565.
Sawai et al., "Reaction Mechanism of Highly Selective Etching of AlSiCu Using Brominated Gas Plasma", 1989 *Dry Process Symposium*, Paper 11-2, pp. 45–50.
*Semiconductor World*, Dec. 1990, pp. 103–107.
Samukawa et al., "Al-4%Cu Dry Etching Technology", *Extended Abstract of the 33rd Integrated Circuit Symposium*, 1987, pp. 115–120.

Primary Examiner—Tom Thomas
Assistant Examiner—Trung Dang
Attorney, Agent, or Firm—Hill, Steadman & Simpson

[57] ABSTRACT

A method of forming an Al-based pattern whereby dry etching with high selectivity of an Al-based metallization layer and effective preventive measures for after-corrosion can be realized. An Al-based multilayer film is etched, for instance, by using an $SOCl_2$ (thionyl chloride) / $C_2$ mixed gas. At this time, thionyl and a C—S bond are introduced into a carbonaceous polymer $CCl_x$ derived from decomposition products of a resist mask, so as to obtain strong chemical bond and electrostatic adsorption force, thereby raising etching durability. Therefore, incident ion energy necessary For anisotropic processing and the deposit amount of the carbonaceous polymer can be reduced, and resist selectivity and selectivity to an underlying layer can be improved. Also, particle pollution and after-corrosion can be controlled. If a compound such as $S_2F_2$ capable of releasing free S on dissociation due to electric discharge is added to $SOCl_2$, pollution in a process can be reduced further. If, after the etching, residual chlorine is removed by $O_2$ plasma ashing or plasma processing using a fluorine based gas, durability to after-corrosion can be improved further.

12 Claims, 1 Drawing Sheet

METHOD OF FORMING ALUMINUM BASED PATTERN

BACKGROUND OF THE INVENTION

This invention relates to a method of forming an aluminum (Al) based pattern, adapted for such applications as the production of semiconductor devices. This invention relates particularly to a method whereby an improvement of resist selectivity, a reduction in particle pollution and a prevention of after-corrosion may be achieved in dry etching of an Al-based metallization layer.

As electrode metallization materials of a semiconductor device, Al-based materials are broadly used, such as, Al, Al—Si alloy consisting of Al with 1 to 2% of silicon being added thereto, and Al—Si—Cu alloy consisting of the Al—Si alloy with 5 to 1% of copper (Cu) being added thereto as preventive measures for stress migration.

Dry etching of the Al-based metallization layer is carried out generally by using a chlorine based gas. A $BCl_3/Cl_2$ mixed gas, disclosed in the Japanese Patent KOKOKU (Publication of Examined Patent Application) Serial No.59-22374, is a typical example. In etching the Al-based metallization layer, a chemical species contributing as a main etchant is chlorine radicals (Cl*), which are voluntary and cause an etching reaction proceed very quickly. However, the use of Cl* alone results isotropic proceedings of the etching. For this reason, a conventional practice is to cause an ion-assisted reaction to proceed with the incident ion energy being raised to a certain level, and to use decomposition products of a resist mask sputtered by the incident ions as sidewall protection films, thereby achieving high anisotropy. $BCl_3$, which is a compound added to reduce a natural oxide film on the surface of the Al-based metallization layer, also plays an important incident ion supplying $BCl_x^+$.

Meanwhile, in the process of sputtering the resist mask by using the incident ion energy which is raised to some extent for securing anisotropy, as described above, a problem of a reduction in the resist selectivity necessarily arises. A selectivity in a typical process is approximately only 2. Such low selectivity generates a dimensional transformation difference from the resist mask in processing a minute metallization pattern, and causes a deterioration of an anisotropic shape.

On the other hand, highly minute design rules of the semiconductor devices demand that the film thickness of a resist coating film be made thin for improvement of the resolution in photolithography. Accordingly, it is becoming difficult to achieve both the high resolution based on the thin resist coating film, and etching with high accuracy via the resist mask formed of the resist coating film.

In order to deal with this problem, deposition of the reaction products onto the resist mask has been proposed so far.

For instance, a process using $SiCl_4$ as an etching gas is reported in the Extended Abstract of the 33rd Integrated Circuit Symposium, 1987, p. 115. The process is aimed at raising etching durability of a resist mask by covering the surface of the resist mask with $CCl_x$ having low vapor pressure.

Also, a process using $BBr_3$ is reported in the Proceedings of the 11th Symposium on Dry Process, p. 45, II-2 (1989). The process is aimed at further raising etching durability of a resist mask by covering the surface of the resist mask with $CBr_x$ having a lower vapor pressure than $CCl_x$. Details of the protection mechanism of the resist mask by using $CBr_x$ are described in the Monthly Journal Semiconductor World, December, 1990, p. 103 to 107, published by the Press Journal Inc., in which the resist selectivity of about 5 is reported.

However, for achieving resist selectivity of the above-mentioned level, it is necessary to deposit a considerable amount of $CCl_x$ or $CBr_x$. Therefore, there is a high possibility of deteriorating the particle level in actual production lines.

OBJECTS AND SUMMARY OF THE INVENTION

It is an object of the present invention to provide a method of forming an Al-based pattern whereby it is possible to achieve a high resist selectivity while controlling particle pollution.

The point of the present invention is to reinforce the film quality of the carbonaceous polymer itself, thereby achieving a sufficiently high resist selectivity despite a reduction in its deposit amount.

As a method of reinforcing the film quality of the carbonaceous polymer itself, in the present invention, a halogen compound having at least one functional group selected from thionyl (SO) and sulfuryl ($SO_2$) and a halogen atom is used.

The halogen atom in the halogen compound contributes as a main etchant for an Al-based metallization layer. An important function of the compound in the etching reaction system of the present invention is that the functional group can have a polarized structure with an S atom being electropositive and an O atom being electronegative, thus having high polymerization promotion activity. In short, the presence of such a functional group or an atomic group derived therefrom raises the polymerization degree of the carbonaceous polymer and durability to incident ions and radical attacks. Also, it has become apparent from recent studies that introduction of the functional group into the carbonaceous polymer increases chemical and physical stability, compared to the conventional carbonaceous polymer simply having a repetitive construction of $-CX_2-$, wherein X represents a halogen atom. This can be intuitively understood from comparison of interatomic bond energy between two atoms, that is, the fact that a C—S bond (713.4 kJ/mol) is larger than a C—C bond (607 kJ/mol). In addition, the introduction of the functional group increases polarity of the carbonaceous polymer, and thus raises an electrostatic adsorption force to the wafer which is negatively electrified during the etching, thereby improving the etching durability of the carbonaceous polymer.

By thus reinforcing the film quality of the carbonaceous polymer itself, it becomes possible to reduce the incident ion energy necessary for anisotropic processing, and to improve the resist selectivity. Accordingly, it becomes possible to form a sufficiently and practically durable etching mask from a relatively thin photoresist coating film, and to prevent generation of processing dimensional transformation differences, without sacrificing the high resolution of photolithography. Also, since the amount of residual chlorine taken into and present in the carbonaceous polymer is reduced, the durability to after-corrosion is improved.

Further, since the reduction in the incident ion energy naturally leads to improvement of the selectivity to the underlying layer, it is possible to reduce, for example, the sputtering of an interlayer insulation film in the underlying layer of the Al-based metallization layer, thereby controlling re-adherence to sidewalls of the pattern. Accordingly, the amount of residual chlorine taken into and present in the re-adhered substance is also reduced, rendering it possible to prevent after-corrosion effectively.

Although the present invention is based on the above-described idea, other methods aiming at lower pollution and lower damage are explained.

One of such methods is to add to the etching gas a sulfur (S) based compound capable of releasing S in a plasma on dissociation due to the electric discharge. In this case, S can be used for sidewall protection, in addition to the carbonaceous polymer which is the etching reaction product. Though depending on conditions, S is deposited on the surface of a wafer if the temperature of the wafer is controlled to room temperature. Consequently, it is possible to reduce the incident ion energy and to achieve low damage thoroughly. It is also possible to relatively reduce the deposit amount of carbonaceous polymer and to reduce the particle pollution and after-corrosion more effectively. In addition, since S is easily sublimated if the wafer is heated to about 90° C. or above, there is no fear of S itself becoming a source of particle pollution.

Further, in the present invention, a method of achieving thorough preventive measure for after-corrosion is proposed. That is, after the end of etching the Al-based metallization layer, plasma processing is carried out by using a processing gas including a fluorine based compound while a substrate or a wafer is heated. By this processing, residual chlorine remaining in the vicinity of the pattern is replaced by fluorine, while vapor pressure of sidewall protection substances bonding or absorbing the residual chlorine is increased by a plasma radiant heat and direct heating of the wafer, so that it becomes easy to release the residual chlorine. Accordingly, even if moisture is absorbed in the wafer after the etching, it is difficult to form a local cell with the residual chlorine being electrolytic, and therefore, it becomes possible to prevent corrosion of the Al-based pattern.

Accordingly, the present invention is very effective for production of the semiconductor device which is designed under the minute design rules and of which high integration, high performance, and high reliability are required.

BRIEF DESCRIPTION OF THE DRAWINGS

FIG. 1a shows a state in which a resist mask is formed on an Al-based multilayer film.

FIG. 1b shows a state in which an Al-based metallization pattern having an anisotropic shape is formed while sidewall protection films are formed.

FIG. 1c shows a state in which the sidewall protection films are removed. FIG. 1d shows a state in which the resist mask is removed by ashing.

DETAILED DESCRIPTION OF THE INVENTION

Figure 1A:
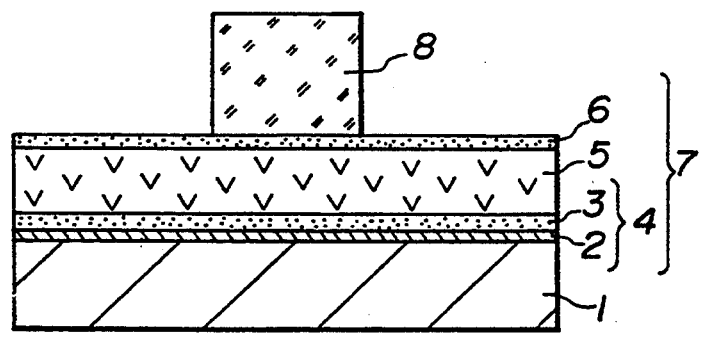
FIGS. 1a to 1d are schematic cross-sectional views showing an example of the application of the present invention to a gate electrode forming process in order.

Referring to the drawings, preferred embodiments of the present invention will be explained hereinafter.

EXAMPLE 1

In the present example, an Al-based multilayer film, which was constituted by a barrier metal, an Al-1% Si layer and an anti-reflection film stacked in order, was etched by using an $SOCl_2$ (thionyl chloride)/$Cl_2$ mixed gas. This process is explained, referring to FIGS. 1a, 1b, and 1d.

First, an Al-based multilayer film 7 was formed by stacking a titanium based barrier metal 4 with a thickness of about 0.13 $\mu$m, an Al-1% Si layer 5 with a thickness of about 0.3 $\mu$m, and a TiON anti-reflection layer 6 with a thickness of about 0.1 $\mu$m on an $SiO_2$ interlayer insulation film 1 in order, and then a resist mask 8 was prepared thereon, as shown in FIG. 1a. The barrier metal 4 was made up of a Ti layer 2 with a thickness of about 0.03 $\mu$m and a TiON layer 3 with a thickness of about 0.1 $\mu$m stacked in order from the bottom.

A wafer formed in this manner was set on an RF biased magnetically-enhanced microwave plasma etcher, and the Al-based multilayer film 7 was etched, for example, under the following conditions:

| | |
|---|---|
| $SOCl_2$ flow rate | 30 SCCM |
| $Cl_2$ flow rate | 90 SCCM |
| gas pressure | 2 Pa (=15 mTorr) |
| microwave power | 900 W (2.45 GHz) |
| RF bias power | 30 W (13.56 MHz) |
| wafer temperature | normal temperature |

$SOCl_2$, which is a liquid substance at the normal temperature, was gasified by bubbling with the use of an He gas and was then introduced into an etching chamber.

In this process, the etching proceeded with a mechanism in which a radical reaction of Cl* as a main etchant dissociated from $Cl_2$ and $SOCl_2$ by ECR discharge was assisted by ions, such as $Cl^{x+}$, $SO^+$, and $SOCl^+$. The Al-based multi layer film was removed i n the form of $AlCl_x$ and $TiCl_x$.

Figure 1B:
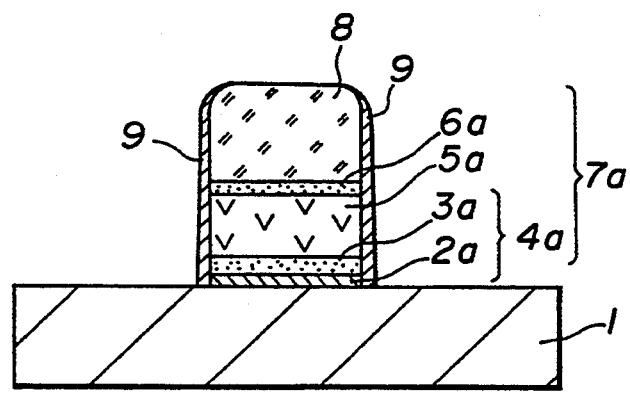

At the same time, $CCl_x$ was derived from decomposition products of the resist mask 8. Thionyl was taken into the structure of the $CCl_x$, thereby forming a rigid carbonaceous polymer. Since the carbonaceous polymer was low in RF bias power, the amount of the formed carbonaceous polymer was not so large as in a conventional process. However, the carbonaceous polymer was deposited on sidewalls of the pattern so as to form sidewall protection films 9, as shown in FIG. 1b, thereby exhibiting high etching durability with a small amount and contributing to anisotropic processing. As a result, an Al-based metallization pattern 7a having a highly anisotropic shape was formed. Meanwhile, in the drawings, each material layer after patterning is denoted by the numeral of the corresponding original material layer with the letter a added thereto.

With an RF bias power Of the above-mentioned level, the underlying $SiO_2$ interlayer insulation film 1 was not sputtered and re-adhered to the sidewalls of the pattern, so that early generation of after-corrosion was prevented. Meanwhile, in the present example, the etch-rate of the Al-based multilayer film 7 was about 950 rim/min., and tile resist selectivity ratio was about 5.

After the etching, the wafer was carried into a plasma ashing device belonging to the etching apparatus, for plasma ashing under conventional conditions. As a result, the resist mask 8 and the sidewall protection films 9 were removed by combustion, as shown in FIG. 1d.

In the present example, since the amount of the formed carbonaceous polymer was small, the particle level did not deteriorate despite repeated wafer processing.

EXAMPLE 2

In the present example, an Al-based multilayer film was etched by using an $SOBr_2$ (thionyl bromide)/$Cl_2$ mixed gas.

Etching conditions in the present example were the same as in example 1 except for the use of $SOBr_2$ instead of $SOCl_2$. Similarly to example 1, $SOBr_2$ was gasified by He-gas bubbling and was then introduced into an etching chamber.

In this etching process, $CCl_x$, $CBr_x$, and carbonaceous polymer formed of $CCl_x$ and $CBr_x$ with thionyl added thereto were formed. These deposits formed sidewall protection films 9. Particularly, since Br is concerned with the etching process as a halogen in the present example, the surface of a resist mask 8 was protected by $CBr_x$, thereby obtaining a resist selectivity ratio of about 6, which was higher than in example 1. Also, since Br is low in reactivity to Si, the selectivity to an underlying $SiO_2$ interlayer insulation film 1 was higher than in example 1.

EXAMPLE 3

In the present example, an Al-based multi layer film was etched by using an $SOCl_2$/$S_2Cl_2$ mixed gas.

First, a wafer as shown in FIG. 1a was set on a magnetically-enhanced microwave plasma etcher, and an Al-based multilayer film 7 was etched, for example, under the following conditions:

| | |
|---|---|
| $SOCl_2$ flow rate | 50 SCCM |
| $S_2Cl_2$ flow rate | 70 SCCM |
| gas pressure | 2 Pa (=15 mTorr) |
| microwave power | 900 W (2.45 GHz) |
| RF bias power | 15 W (13.56 MHz) |
| wafer temperature | 0° C. (with the use of an ethanol based coolant) |

For cooling the wafer, an ethanol based coolant was supplied from a chiller provided outside of the etcher, and was circulated in a cooling pipe buried in a wafer setting electrode.

In this etching process, S dissociated from $S_2Cl_2$, besides the carbonaceous polymer including $CCl_x$ and thionyl, contributed as a component element of sidewall protection films 9. Accordingly, an Al-based metallization pattern 7a having a highly anisotropic shape was formed even with an RF bias power lower than in example 1. In the present example, because of the cooling the wafer and an increased amount of the deposits, the etching rate of the Al-based multilayer film 7 was about 900 nm/min., which was slightly lower than in example 1. However, the resist selectivity ratio was improved to about 9. Thus, a reduction in the film thickness of a resist mask 8 and retreat of an edge were scarcely observed. Also, durability to after-corrosion was improved significantly for the following reasons: the; expected deposition of S rendered it possible to reduce the amount of the carbonaceous polymer to be formed; and the improvement of the selectivity to the underlying layer due to low bias prevented sputtering and re-adherence of an $SiO_2$ interlayer insulation film 1.

When plasma ashing was carried out after the etching, the resist mask 8 and sidewall protection films 9 were removed quickly, as shown in FIG. 1d. Although the sidewall protection films 9 contained the carbonaceous polymer and S, S was removed by a combustion reaction due to O* as well as by sublimation due plasma radiant heat and reaction heat, thereby leaving no particle pollution on the wafer.

EXAMPLE 4

In the present example, an Al-based multilayer film was etched by using an $SOBr_2$/$S_2Cl_2$ mixed gas.

First, a wafer as shown in FIG. 1a was set on a magnetically-enhanced microwave plasma etcher, and an Al-based multilayer film 7 was etched, for example, under the following conditions:

| | |
|---|---|
| $SOBr_2$ flow rate | 30 SCCM |
| $S_2Cl_2$ flow rate | 90 SCCM |
| gas pressure | 2 Pa (=15 mTorr) |
| microwave power | 900 W (2.45 GHz) |
| RF bias power | 10 W (13.56 MHz) |
| wafer temperature | 0° C. (with the use of an ethanol based coolant) |

In this etching process, since Br is concerned with the etching reaction system, highly anisotropic processing was carried out despite the RF bias lower than in example 3. The resist selectivity ratio was about 10, which was higher than in example 3. Also, the selectivity to an underlying $SiO_2$ interlayer insulation film 1 and durability to after-corrosion were improved.

EXAMPLE 5

In the present example, an Al-based multilayer film was etched by using an $SO_2Cl$ (sulfuryl chloride) /$S_2Cl_2$ mixed gas, and then plasma processing was carried out by using a $CF_4$/$O_2$ mixed gas. This process is explained, referring to FIGS. 1a to 1d.

First, a wafer as shown in FIG. 1a was set on a magnetically-enhanced microwave plasma etcher, and an Al-based multilayer film 7 was etched, for instance , under the following conditions.

| | |
|---|---|
| $SO_2Cl_2$ flow rate | 50 SCCM |
| $S_2Cl_2$ flow rate | 70 SCCM |
| gas pressure | 2 Pa (=15 mTorr) |
| microwave power | 900 W (2.45 GHz) |
| RF bias power | 15 W (13.56 MHz) |
| wafer temperature | 0° C. (with the use of an ethanol based coolant) |

$So_2Cl_2$, which is a liquid substance at the normal temperature, was gasified by bubbling with the use of an He gas and was then introduced into an etching chamber.

In this etching process, $CCl_x$ and a rigid carbonaceous polymer, made up of $CCl_x$ with sulfuryl or thionyl formed by decomposition of sulfuryl being taken thereinto, were formed. Sidewall protection films 9 were formed by the carbonaceous polymer and S formed from $S_2Cl_2$, as shown in FIG. 1b, and an Al-based metallization pattern 7a having an anisotropic shape was formed.

Next, the wafer was car tied into a post-etching processing chamber belonging to the etcher, and was processed with a plasma, for instance, under the following conditions:

| | |
|---|---|
| $CF_4$ flow rate | 100 SCCM |
| $O_2$ flow rate | 50 SCCM |
| gas pressure | 10 Pa (=75 mTorr) |
| microwave power | 900 W (2.45 GHz) |
| RF bias power | 0 W (13.56 MHz) |
| wafer temperature | 100° C. |

Figure 1C:
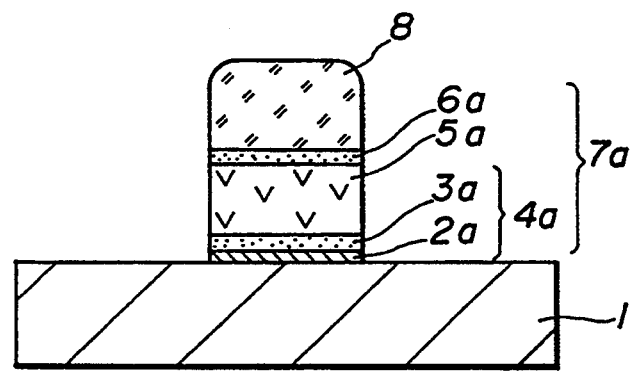
Figure 1D:
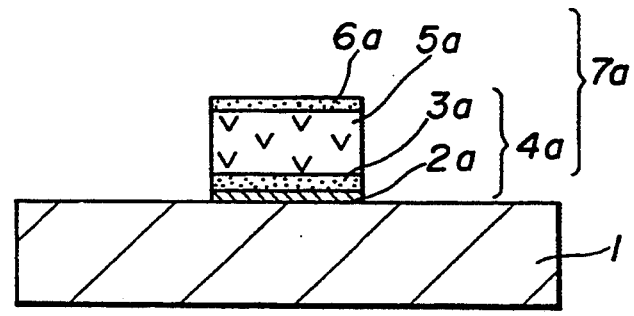

The sidewall protection films 9 were quickly removed by this plasma processing, as shown in FIG. 1c. The mechanism of removal is that the carbonaceous polymer was removed by combustion due to O* and by an increase in vapor pressure due to fluorine replacement, and that S was removed by sublimation due to heating of the wafer, combustion due to O*, and formation of $SF_x$ due to F*.

Meanwhile, with the plasma processing, Cl absorbed in a resist mask 8 was replaced by F.

Then, the resist mask 8 was removed by the conventional plasma ashing, as shown in FIG. 1d. The wafer was experimentally exposed to the atmosphere after resist ashing. However, generation of after-corrosion was not observed even 72 hours later.

EXAMPLE 6

In the present example, an Al-based multi layer film was etched by using an $SOBr_2/S_2Cl_2$ mixed gas, and was processed with a plasma by using a $CF_4/O_2$ mixed gas.

In the present example, a wafer as shown in FIG. 1a was set on a magnetically-enhanced microwave plasma etcher. After an Al-based multi layer film 7 was etched under the same conditions as in example 4, the wafer was processed with a plasma under the same conditions as in example 5.

In this process, since etching with high selectivity was carried out by using a Br based chemical species, the deposit amount of the carbonaceous polymer was reduced further. After resist ashing, the wafer was experimentally exposed to the atmosphere. However, generation of after-corrosion was not observed even 96 hours later.

Though explained on the basis of the six examples hereinabove, the present invention is not limited to these examples.

For instance, as a halogen compound having thionyl and a halogen atom in a molecule, SOClBr (thionyl chloride bromide; liquid) can be used, besides the above-mentioned $SOCl_2$ and $SOBr_2$. As compounds of similar type, $SOF_2$ (thionyl fluoride) and $SOF_4$ (thionyl tetrafluoride) are known. However, F* released from these compounds, combined with Al and Ti, forms $AlF_x$ and $TiF_x$ having low vapor pressure, and is likely to slow the etchrate and deteriorate the particle level. Therefore, it is necessary to consider the heating of the wafer within a range which does not deteriorate heat resistance of the resist mask. Also, as halogen compounds having sulfuryl and a halogen atom in a molecule, $SO_2ClF$ (sulfuryl chloride fluoride) and $SO_2BrF$ (sulfuryl bromide fluoride; liquid) are known, besides the above-mentioned $SO_2Cl_2$. However, since these compounds release F*, similar consideration is needed.

Meanwhile, the compounds denoted by "liquid" following their names are liquid at the normal temperature, and the other compounds are gaseous.

As sulfur based compounds which can release sulfur in a plasma on dissociation due to electric discharge, sulfur chloride such as $S_3Cl_2$ and $SCl_2$, sulfur bromide such as $S_3Br_2$, $S_2Br_2$ and $SBr_2$, and $H_2S$ can be used, besides the above-mentioned $S_2Cl_2$. Also, sulfur fluoride such as $S_2F_2$, $SF_2$, $SF_4$, and $S_2F_{10}$ can release S. However, since these compounds release F*, the above-mentioned consideration is needed.

A rare gas, such as Ar and He, can be added to the etching gas used in the present; invention, for sputtering, dilution, and cooling effects.

As a gas used for plasma processing, an $NF_3/O_2$ mixed gas can be used, besides the above-mentioned $CF_4/O_2$ mixed gas.

In addition, the structure of the sample wafer, the etcher to be used, and the etching conditions can be changed as a matter of convenience.

What is claimed is:

1. A method of forming an aluminum based pattern comprising etching an aluminum based metallization layer on a substrate by using an etching gas containing a halogen compound having at least one functional group selected from the group consisting of thionyl and sulfuryl, and a halogen atom in a molecule.

2. The method of forming an aluminum based pattern as claimed in claim 1 wherein said halogen compound is at least one kind of compound selected from the group consisting of thionyl chloride, thionyl bromide, thionyl chloride bromide, and sulfuryl chloride.

3. The method of forming an aluminum based pattern as claimed in claim 1 wherein, after said etching, a resist mask used for said etching and deposits formed during said etching are removed by combustion through oxygen plasma ashing.

4. The method of forming an aluminum based pattern as claimed in claim 1 wherein, after said etching, plasma processing is carried out by using a processing gas containing a fluorine based compound while heating said substrate.

5. The method of forming an aluminum based pattern as claimed in claim 1 wherein said aluminum based metallization layer is a multilayer film formed by stacking a titanium based barrier metal, an aluminum based material layer and a titanium based anti-reflection film in order.

6. A method of forming an aluminum based pattern comprising etching an aluminum based metallization layer on a substrate by using an etching gas containing a halogen compound having at least one functional group selected from the group consisting of thionyl and sulfuryl and a halogen atom in a molecule, and a sulfur based compound capable of releasing sulfur in a plasma on dissociation due to electric discharge.

7. The method of forming an aluminum based pattern as claimed in claim 6 wherein said etching is carried out by controlling temperature of said substrate to 90° C. and below while depositing at least sulfur.

8. The method of forming an aluminum based pattern as claimed in claim 6 wherein said halogen compound is at least one compound selected from the group consisting of thionyl chloride, thionyl bromide, thionyl chloride bromide, and sulfuryl chloride.

9. The method of forming an aluminum based pattern as claimed in claim 6 wherein said sulfur based compound at least one compound selected from the group consisting of $S_3Cl_2$, $S_2Cl_2$, $SCl_2$, $S_3Br_2$, $S_2Br_2$, $SBr_2$, and $H_2S$.

10. The method of forming an aluminum based pattern as claimed in claim 6 wherein, after said etching, a resist mask used for said etching and deposits formed during said etching are removed by combustion through oxygen plasma ashing.

11. The method of forming an aluminum based pattern as claimed in claim 6 wherein, after said etching, plasma processing is carried out by using a processing gas containing a fluorine based compound while heating said substrate.

12. The method of forming an aluminum based pattern as claimed in claim 6 wherein said aluminum based metallization layer is a multilayer film formed by stacking a titanium based barrier metal, an aluminum based material layer and a titanium based anti-reflection film in order.

* * * * *